(12) United States Patent
Kadirvel et al.

(10) Patent No.: US 10,983,170 B1
(45) Date of Patent: Apr. 20, 2021

(54) APPARATUS AND METHOD FOR IN-SITU BATTERY SWELL MEASUREMENT

(71) Applicant: FACEBOOK TECHNOLOGIES, LLC, Menlo Park, CA (US)

(72) Inventors: Karthik Kadirvel, San Jose, CA (US); Jason Howard, Alpharetta, GA (US)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 57 days.

(21) Appl. No.: 16/450,805

(22) Filed: Jun. 24, 2019

Related U.S. Application Data

(60) Provisional application No. 62/791,680, filed on Jan. 11, 2019.

(51) Int. Cl.
| | |
|---|---|
| *G01R 31/00* | (2006.01) |
| *G01R 31/389* | (2019.01) |
| *H01M 10/44* | (2006.01) |
| *H01M 10/42* | (2006.01) |
| *H01M 10/48* | (2006.01) |

(52) U.S. Cl.
CPC ........ *G01R 31/389* (2019.01); *H01M 10/425* (2013.01); *H01M 10/441* (2013.01); *H01M 10/482* (2013.01)

(58) Field of Classification Search
None
See application file for complete search history.

(56) References Cited

U.S. PATENT DOCUMENTS

2014/0042961 A1\* 2/2014 Lan .................. H02J 7/0068
320/107

\* cited by examiner

*Primary Examiner* — Jas A Sanghera
(74) *Attorney, Agent, or Firm* — Morgan, Lewis & Bockius LLP

(57) ABSTRACT

An apparatus for monitoring battery swelling includes a conductive layer adhered to a battery pack, a surface opposite the battery pack, a flex layer adhered to the bottom of the surface, and a resistance measurement circuit. The conductive layer includes one or more conductive strips. The flex layer includes a resistive pattern with one or more serially connected resistive segments. Each resistive segment is aligned to a respective conductive strip. The surface is positioned over the battery pack so that initially the resistive pattern is not in contact with and is electrically separated from the conductive layer. The resistance measurement circuit is connected to the resistive pattern to detect changes in resistance of the resistive pattern. When the battery pack swells, the resistive pattern comes in contact with the conductive layer, thereby shorting a resistive segment, and causes the resistance measurement circuit to detect the change in the resistance.

20 Claims, 11 Drawing Sheets

500 — Headset Assembly with Battery at the Back (Battery lid removed, shows swell detector)

APPARATUS AND METHOD FOR IN-SITU BATTERY SWELL MEASUREMENT

RELATED APPLICATION

This application claims priority to U.S. Provisional Application Ser. No. 62/791,680, filed Jan. 11, 2019, entitled "System and Method for In-Situ Swell Measurement," which is incorporated by reference herein in its entirety.

TECHNICAL FIELD

The disclosed implementations relate generally to battery systems, and more specifically to an apparatus and method for detecting swelling in battery systems.

BACKGROUND

Consumer electronic products use lithium ion (Li-ion) batteries as power sources. These batteries are housed in plastic or metallic enclosures, which are designed to be thin to meet product use-case and aesthetic requirements. The thickness of Li-ion batteries increases over time, even during normal use, and due to adverse conditions. Long-term swelling in Li-ion cells may be caused by electrolyte degradation (which releases gaseous by-products) or material deposits on the electrode surfaces.

The increase in battery dimensions over time can lead to damages in the product housing. For example, swelling leads to display bulges and cracking in cell phones and tablets, keyboard damage in laptops, and top cover damage in head mounted devices like virtual reality (VR) headsets. While VR headsets share design considerations (e.g., aesthetics) with other consumer products, such as cell phones, VR headsets are also different in that there is relatively more spatial budget (e.g., for adding circuits to monitor swelling) compared to other products. However, because the headsets are worn on the head, there is an increased need to limit battery swelling. Typically, the product housing is designed to accommodate a reasonable amount of battery swell, which is based on expected product use case and a priori characterization of the battery characteristics. However, a priori characterizations are usually based on a very limited sample of actual expected use cases. Hence, there is a high probability that the field use case does not meet the characterization conditions.

SUMMARY

Accordingly, there is a need for a robust, and low cost solution, with minimal impact to product design, to continuously monitor battery swelling. The apparatus and methods described herein provide such a solution. Once the swell is detected, appropriate action can be initiated based on product goals to prevent damage to the end system. For example, the charging profile may be modified to maintain the cell in a lower state of charge to reduce the gas generation rate in the cell.

In one aspect, an apparatus for monitoring battery swelling is provided, according to some implementations. The apparatus includes a battery pack, and a conductive layer adhered to a first side of the battery pack. The conductive layer includes one or more conductive strips, each conductive strip disposed separate from the others. The apparatus also includes a surface opposite the battery pack. In some implementations, the surface is a lid covering the battery pack. A flex layer is adhered to the bottom of the surface. The flex layer includes a resistive pattern, including one or more serially connected resistive segments. Each resistive segment is aligned to a respective conductive strip. The surface is positioned over the battery pack so that, without application of pressure, the resistive pattern is not in contact with the conductive layer and is electrically separated from the conductive layer. The apparatus also includes a resistance measurement circuit connected to the resistive pattern. The resistance measurement circuit detects changes in resistance of the resistive pattern.

In some implementations of the apparatus, the resistance measurement circuit is further configured to detect resistance changes at time intervals that are spaced apart (e.g., every 24 hours).

In some implementations of the apparatus, when the battery swells, the first side of the battery pack forms a dome shape. The conductive layer is adhered to the first side so that at least one conductive strip of the one or more conductive strips is aligned to the top of the dome.

In some implementations of the apparatus, when the battery pack swells, the resistive pattern comes in contact with the conductive layer and is electrically connected to the conductive layer, thereby shorting a resistive segment. This causes the resistance measurement circuit to detect the change in the resistance.

In some implementations of the apparatus, the resistance measurement circuit is further configured to signal an update to a charging profile of the battery pack which it detects a change in the resistance.

In some implementations of the apparatus, each resistive segment includes a resistor connected to a pair of conductive pads at its ends. The resistive segments are serially connected via the respective conductive pads.

In some implementations of the apparatus, the resistance level of each resistive segment exceeds a threshold. A short in a resistive segment reduces the resistance below the threshold, which is detected by the resistance measurement circuit.

In some implementations of the apparatus, the number, size, shape, and location of the one or more resistive segments, and the one or more conductive strips are determined so that the resistance measurement circuit detects false positives of swelling of the battery pack.

In some implementations of the apparatus, the flex layer is adhered to the first side of the battery pack, and the conductive layer is adhered to the bottom of the surface.

In some implementations of the apparatus, the resistance measurement circuit is coupled to a memory unit, and the resistance measurement circuit is further configured to detect and store resistances of the resistive pattern, and to use the stored resistances when determining changes in resistance of the resistive pattern (e.g., using an average of multiple distinct measurements, which can avoid reporting a temporary aberration as a battery swell).

In some implementations of the apparatus, each conductive strip is disposed laterally along a longitudinal centerline of the battery pack.

In some implementations of the apparatus, the conductive layer is adhered to the side of the battery pack that is most likely to swell.

In another aspect, a method is provided for monitoring battery swelling, according to some implementations. The method includes adhering a conductive layer to a first side of a battery pack. The conductive layer includes one or more conductive strips, and each conductive strip disposed separate from the others. The method also includes adhering a flex layer to a bottom portion of a surface opposite the battery pack. In some implementations, the surface is a lid covering the battery pack. The flex layer includes a resistive pattern. The resistive pattern includes one or more serially connected resistive segments, where each resistive segment is aligned to a respective conductive strip. The method further includes positioning the surface over the battery pack. Without application of pressure, the resistive pattern is not in contact with the conductive layer and is electrically separated from the conductive layer. The method includes configuring a resistance measurement circuit to measure resistance of the resistive pattern, and operating the resistance measurement circuit to measure resistance of the resistive pattern.

In some implementations, configuring the resistance measurement circuit comprises calibrating the circuit to detect shorts in the one or more resistive segments.

In some implementations, the resistance level of each resistive segment exceeds a threshold so that a short in a resistive segment is detected by the resistance measurement circuit.

In some implementations, configuring the resistance measurement circuit further comprises calibrating the resistance measurement circuit to detect false positives of swelling of the battery pack based on the number, size, shape, and location of the one or more resistive segments, and the one or more conductive strips.

In some implementations, the method includes operating the resistance measurement circuit at time intervals that are spaced apart.

In some implementations, the method further includes storing the resistance measurements, and re-calibrating the resistance measurement circuit to detect shorts in the one or more resistive segments based on the stored resistance measurements.

In some implementations, the method further includes positioning the surface over the battery pack. When the battery pack swells, the resistive pattern comes in contact with and is electrically connected to the conductive layer, thereby shorting a resistive segment.

In some implementations, when the battery swells, the first side of the battery pack is dome-shaped. The method includes adhering the conductive layer to the first side so that at least one conductive strip of the one or more conductive strips is aligned to the top of the dome.

In some implementations, the method further includes signaling an update to a charging profile of the battery pack when a change in resistance of the resistive pattern is detected during operation of the resistance measurement circuit.

In some implementations, the method further includes adhering the conductive layer to a side of the battery pack that is more likely to swell.

Thus apparatuses and methods are provided that continuously monitor battery systems and detect swelling using a resistance measurement circuit.

BRIEF DESCRIPTION OF THE DRAWINGS

For a better understanding of the aforementioned implementations of the invention as well as additional implementations, reference should be made to the Description of Implementations below, in conjunction with the following drawings in which like reference numerals refer to corresponding parts throughout the figures.

Reference will now be made in detail to implementations, examples of which are illustrated in the accompanying drawings. In the following detailed description, numerous specific details are set forth in order to provide a thorough understanding of the present invention. However, it will be apparent to one of ordinary skill in the art that the present invention may be practiced without these specific details.

DESCRIPTION OF IMPLEMENTATIONS

Figure 1A:
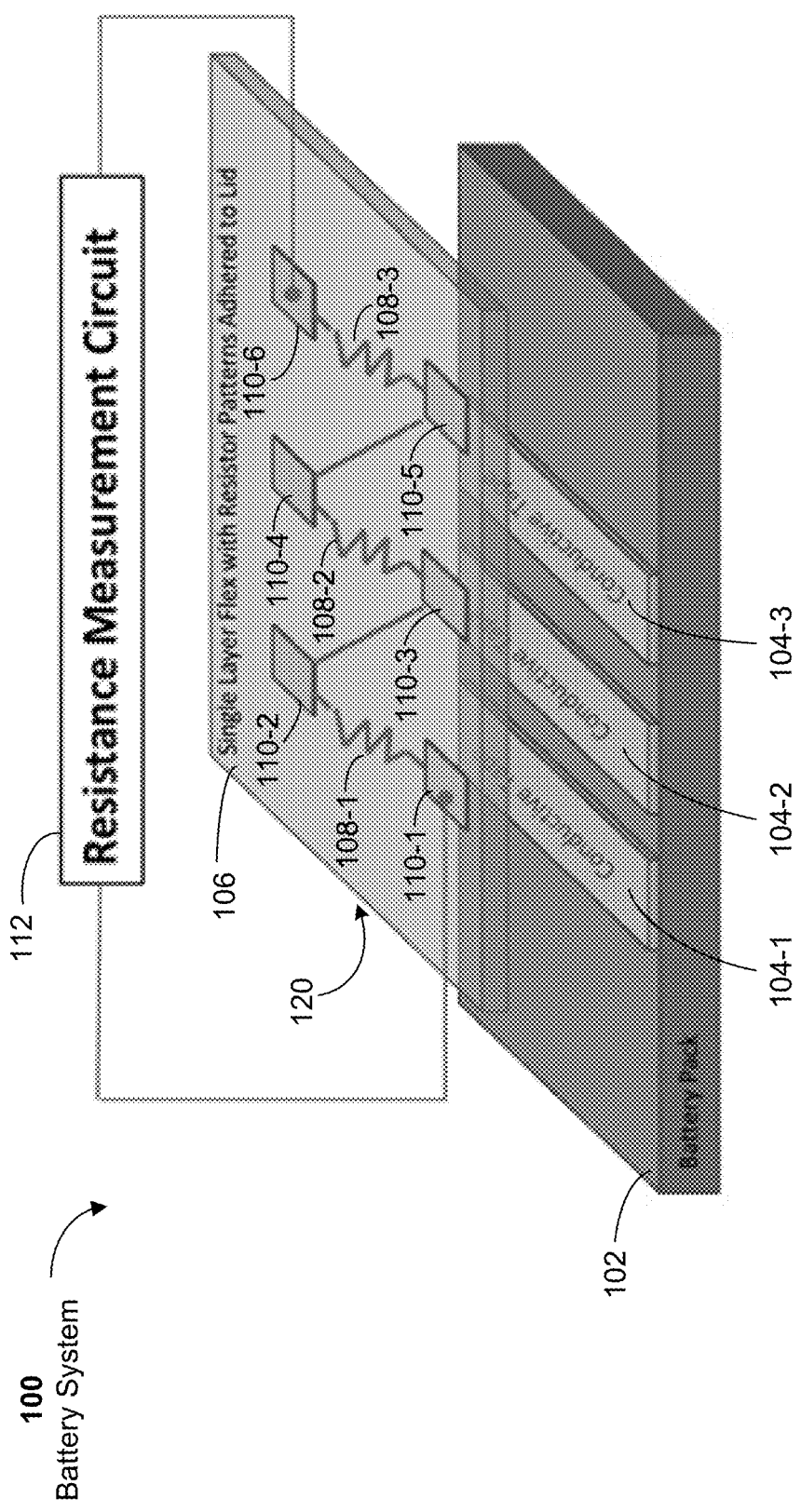
FIG. 1A illustrates a battery system to detect swelling.

FIG. 1A illustrates a battery system 100 to detect swelling, in accordance with some implementations. FIG. 1A shows an apparatus 100 (sometimes called a battery system) for monitoring battery swelling, according to some implementations. The apparatus includes a battery pack 102. For example, a typical battery pack is rectangular in shape, housed in a container, and a metal lid covers the battery pack.

The battery system 100 includes a conductive layer adhered to a first side of the battery pack 102. The conductive layer includes one or more conductive strips (e.g., conductive tapes 104-1, 104-2, and 104-3), which are separated relative to each other. In some implementations, The conductive layer consists of copper tape or flexible printed circuit board (PCB) that is adhered to the top to the battery pack 102 using a pressure sensitive adhesive (PSA), according to some implementations. In some implementations of the apparatus, the conductive layer is adhered to the side of the battery pack that is more likely to swell (compared to other sides of the battery pack). For example, offline experimentation with the battery pack 102, or the battery pack 102 in combination with a housing, is used to determine which side of the battery pack 102 is most likely to swell. For example, when a battery pack 102 is placed in a housing, typically, the battery tends to swell at the top (e.g., away from the rigid base), according to some implementations.

The apparatus 100 also includes a surface 106 opposite the battery pack 102. A flex layer 120 (e.g., a 50-micron thick polyimide film) is adhered to the bottom of the surface 106. For example, in FIG. 1A, on the underside of the surface 106, a flexible PCB is adhered, according to some implementations. The flex layer 120 includes a resistive pattern (e.g., the zig-zag pattern of resistors) including one or more serially connected resistive segments. In some implementations of the apparatus 100, each resistive segment includes a resistor connected to a pair of conductive pads at its ends. The one or more resistive segments are serially connected via the respective conductive pads. The conductive pads are made of conductive material, such as copper, or gold. For example, FIG. 1A shows a first segment consisting of the conductive pads 110-1 and 110-2, and the resistor 108-1; a second segment consisting of the conductive pads 110-3 and 110-4, and the resistor 108-2; and a third segment consisting of the conductive pads 110-5 and 110-6, and the resistor 108-3. In some implementations of the apparatus 100, each conductive strip is disposed laterally along a longitudinal centerline of the battery pack 102. For example, in FIG. 1A, conductive tapes 104-1, 104-2, and 104-3 are each laid out perpendicular to an axis through the top of the battery pack 102.

In some implementations, each resistive segment is aligned to a respective conductive strip. For example, in FIG. 1A, the first segment consisting of the conductive pads 110-1 and 110-2, and the resistor 108-1 is aligned to the first conductive tape 104-1; the second segment consisting of the conductive pads 110-3 and 110-4, and the resistor 108-2 is aligned to the second conductive tape 104-2; and the third segment consisting of the conductive pads 110-5 and 110-6, and the resistor 108-3 is aligned to the third conductive tape 104-3. In some implementations, the total resistance of the pattern in the flex layer (e.g., the flex PCB layer in FIG. 1A) is on the order of several k$\Omega$ (e.g., 1-10 k$\Omega$). In some implementations, the cost of the flex layer is minimized by using a single layer flex PCB with no components other than the resistors. Some implementations of the flex layer use a plastic or polyester sheet with printed inks, thereby reducing the cost even more. In some implementations, the volume and thickness of the flex layer are minimal (e.g., thickness is less than 100 µm).

The surface 106 is positioned over the battery pack 102 so that, without application of pressure, the resistive pattern is not in contact with the conductive layer and is electrically separated from the conductive layer (e.g., separated by air). The apparatus 100 also includes a resistance measurement circuit 112 connected to the resistive pattern and configured to detect changes in resistance of the resistive pattern. In some implementations, the resistance measurement circuit 112 measures resistance of the resistive pattern and uses that measurement to detect resistance changes. During normal operation, there is a gap between the conductive strips (on top of the battery) and the flex PCB (on the bottom of the surface), and the resistance measured by the external circuit is substantially a constant value. For example, the resistance measurement circuit 112 includes a processor having an ADC that can measure resistance.

In general, environmental changes, such as humidity, pressure, vibration or shocks, have little to no impact on system 100. In some implementations, the system 100 is manufactured using conventional manufacturing processes. For example, applying flex PCBs via PSA is a very common practice in the industry.

In some implementations, the system 100 provides continuous monitoring of battery swelling during normal and abnormal conditions. For example, a normal condition includes an operating temperature range of 20-30° C., which allows normal operation of a product using the battery system 100. Between 30-45° C., some but not all operations of the product are permitted. An abnormal range includes an operating temperature range above 45° C., at which point most operations of the product are throttled. Some implementations throttle battery charging at different operating temperature ranges.

In some implementations of the apparatus 100, the resistance measurement circuit 112 is further configured to detect resistance changes at time intervals that are spaced apart. The power consumed by the swell detection circuitry 112 is negligible, according to some implementations. The resistance readout circuit is enabled at very low duty cycles (e.g., <0.0001% of up-time, such as 100 milliseconds every 24 hours). In some implementations, once the resistance readout circuit measures one or more abnormal resistance values or when the circuit detects an unexpected drop in resistance, the periodic interval of operation of the circuit is increased (e.g., switching to operate hourly rather than daily) to detect any further changes in the resistance values (thereby reducing the risk of rapid deterioration). This way, for example, the system 100 can avoid repeating false positives as well as operate during abnormal conditions (e.g., during a shock or similar event). In some implementations of the apparatus 100, the resistance level of each resistive segment exceeds a specific threshold value. In this way, a short in a resistive segment causes the measured resistance to fall below the threshold value, so it is detected by the resistance measurement circuit. In some implementations, the resistance measurement circuit is configured to tolerate of changes in resistance (e.g., due to battery swells) up to the threshold value, which accommodates fluctuations in the ambient temperature or other physical conditions (e.g., the room where the product using the battery system 100 is placed), or changes in physical conditions.

Figure 1B:
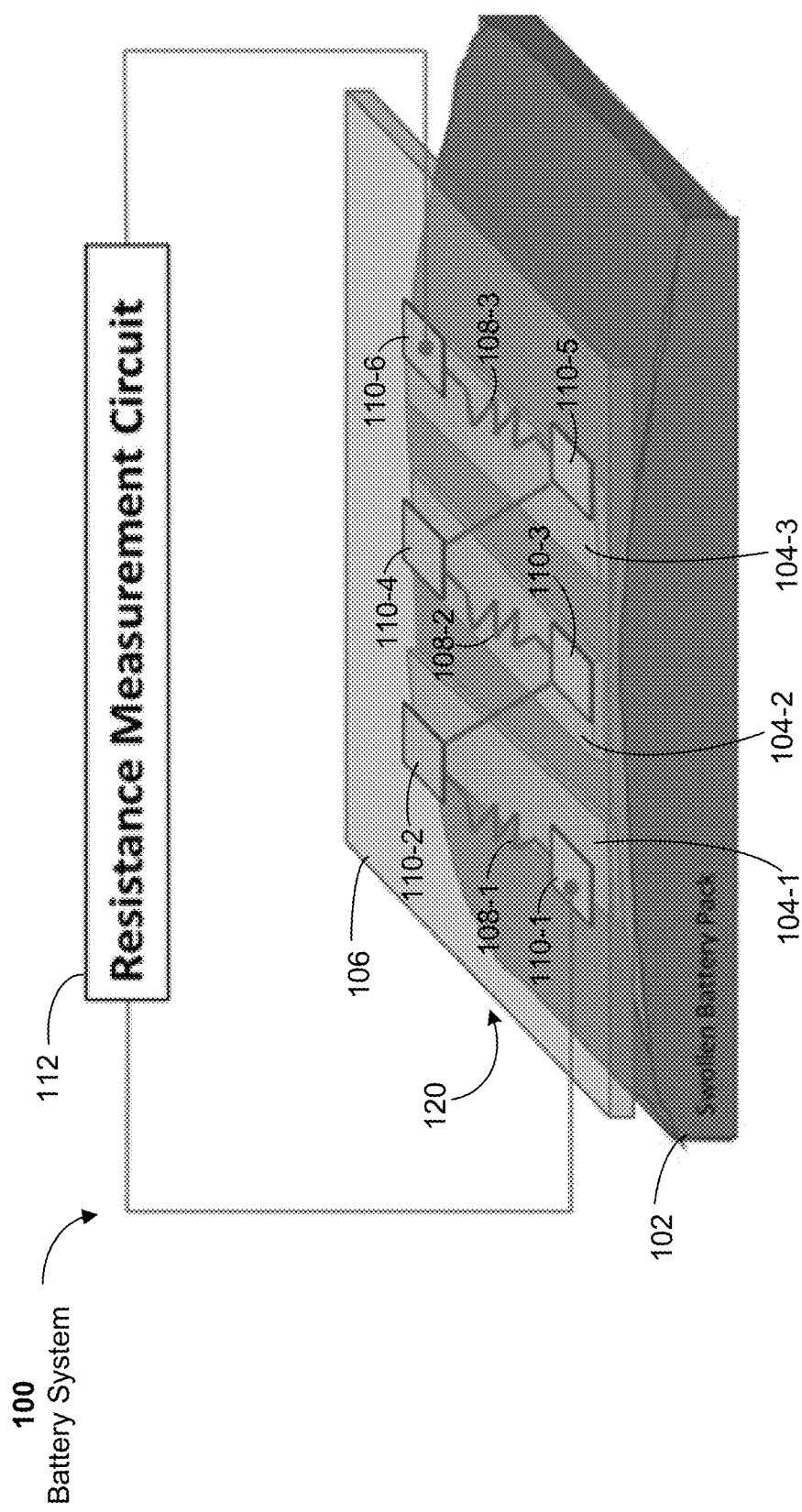
FIG. 1B illustrates a state of the battery system shown in FIG. 1A when the battery swells, in accordance with some implementations.

FIG. 1B illustrates a state of the battery system shown in FIG. 1A when the battery pack 102 swells, in accordance with some implementations. In some implementations of the apparatus 100, when the battery 102 swells, the first side of the battery pack 102 forms a dome shape (e.g., the dome shape shown in FIG. 1B), and the conductive layer (e.g., the tapes 104-1, 104-2, and 104-3) has been adhered to the first side so that at least one conductive strip of the one or more conductive strips is aligned to the top of the dome. For example, in FIG. 1A, the second conductive tape 104-2 is placed near the center of the top of the battery pack 102 because that region is where the battery 102 is likely to swell (more than at the locations of the other two strips 104-1 and 104-3) to form a dome shape.

In some implementations of the apparatus 100, when the battery pack 102 swells, the resistive pattern comes in contact with the conductive layer and is electrically connected to the conductive layer, thereby shorting a resistive segment. This causes the resistance measurement circuit to detect the change in the resistance. For example, in FIG. 1B, the second conductive strip 104-2, followed by the other conductive strips 104-1 and/or 104-3 raise due to the swollen battery pack 102 and come in contact with the respective segments under the surface 106.

When the battery 102 swells, the conductive strips on the battery pack make contact with the exposed pads (e.g., the pads 110-1 and 110-2, the pads 110-3 and 110-4, and the pads 110-5 and 110-6) on the flex layer and short out the patterned resistors. For example, contact between the first conductive tape 104-1 with the pads 110-1 and 110-2 shorts the first resistor 108-1; contact between second conductive tape 104-2 with the pads 110-3 and 110-4 shorts the second resistor 108-2; and contact between the third conductive tape 104-3 with the pads 110-5 and 110-6 shorts the third resistor 108-3. In some implementations, this resistance change is detected by the external circuit 112. The system 100 can then take appropriate action based on this information.

Figure 4:
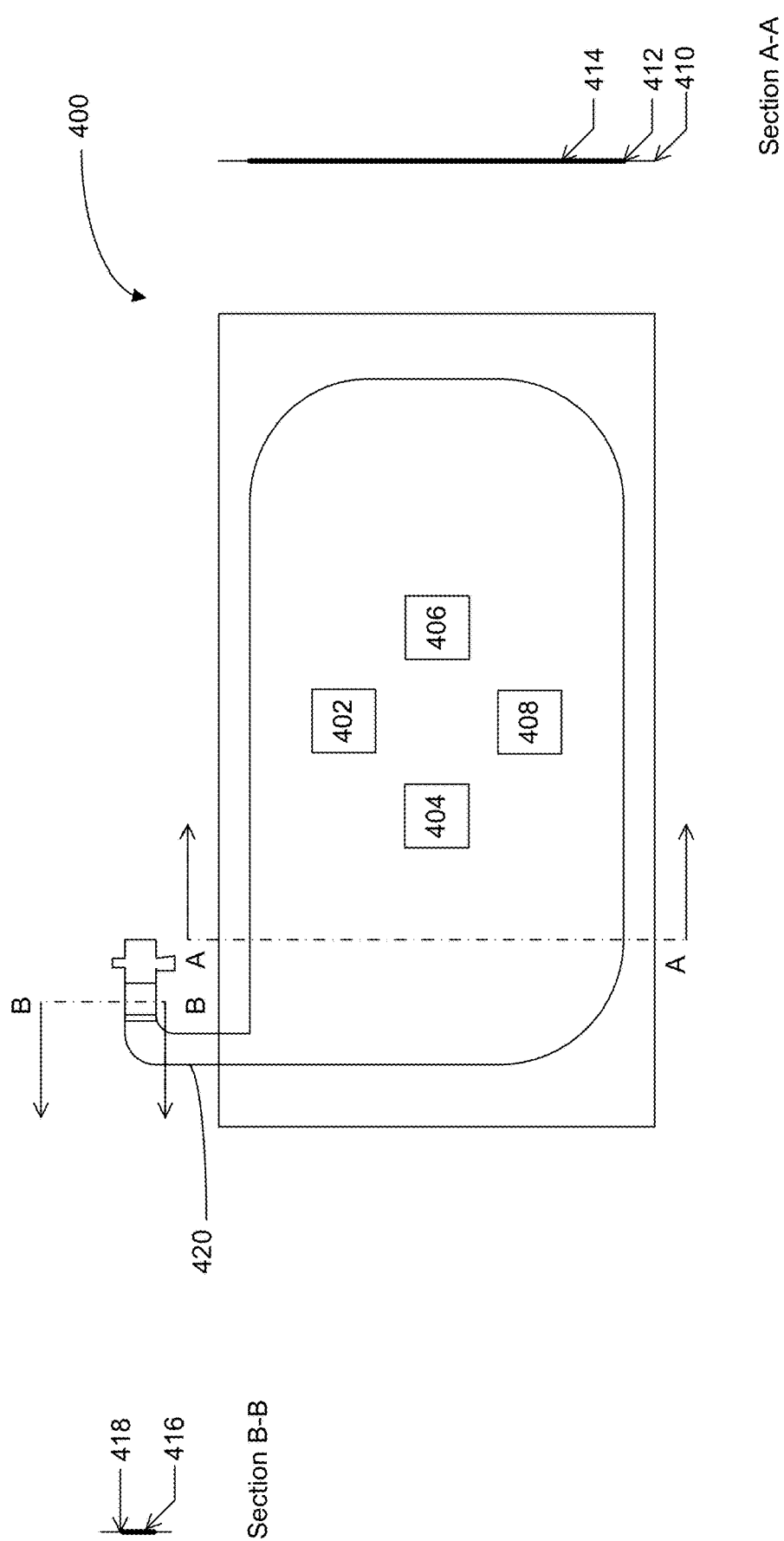
FIG. 4 illustrates a battery system configuration that can detect swelling, in accordance with some implementations.

In some implementations of the apparatus 100, the number, size, shape, and location of the one or more conductive strips are determined so that the resistance measurement circuit detects (and recognizes) false positives of swelling of the battery pack 102. FIG. 4 below illustrates positioning of conductive pads (configured to be adhered to the back of a battery pack) to enable the resistance measurement circuit to detect false positives, according to some implementations. In some implementations, the number and strength of the resistive segments can be configured to provide information about varying levels of pressure. To illustrate, a greater number of resistive segments are placed away from the center-line than near the center line. In this way, when a resistive segment at the periphery shorts out before the segment aligned with the center-line, the circuit 112 can infer that the battery pack 102 is not actually swollen. In some implementations, the resistance values of the different resistors vary, which enables the circuit to infer false positives. For example, the resistance values of resistors 108-1 and 108-3 are an order of magnitude different from that of resistor 108-2 so that when 108-1 or 108-3 short before resistor 108-2, circuit 112 can infer that the battery pack 102 did not swell. For example, the first and third resistors may be 2 kΩ, whereas the second resistor is 1 kΩ (or vice versa). In some implementations, the circuit 112 checks the robustness of the resistance signal by measuring resistance changes over different intervals of time (e.g., averaging multiple measurements).

In some implementations of the apparatus 100, the resistance measurement circuit 112 is coupled to a memory unit, and the resistance measurement circuit 112 is further configured to detect and store resistances of the resistive pattern, and to use the stored resistances to determine changes in the resistance of the resistive pattern.

In some implementations of the apparatus 100, the resistance measurement circuit 112 is further configured to send an instruction to update the charging profile of the battery pack 102. In some implementations, the voltage level used to charge the battery pack or cells is adjusted based on this instruction (e.g., cells that are typically charged at 4.4 volts are instead charged at 4.2 volts). In some implementations, the charging profile is progressively adjusted based on the amount of swelling (or the rate of swelling). In some implementations, maintenance charge of the system (used to maintain a certain level of charge) is adjusted based on battery swelling. In some implementations, the temperature ranges of operation (of the product using the battery system) are adjusted based on the amount or the rate of swelling. For example, some systems allow normal charging up to a predefined temperature threshold (e.g., 45° C.), and turn that down based on the swelling detected. Some implementations control voltage and/or current at different operating temperatures based on the swelling. Some implementations generate one or more alert signals (e.g., an LED light is lit, or an alarm sound is played) when the battery swelling exceeds a predetermined threshold. Some implementations use a top off delay (for charging) when the battery swelling exceeds a predetermined threshold. Some implementations reduce the state of charge (SOC) of the battery when the battery swelling exceeds a predetermined threshold. Some systems alert a customer care or service center when the battery swelling exceeds a predetermined threshold. In some implementations, when the battery supplies battery power to a device (e.g., a headset) and battery swelling is detected, the device is disabled (e.g., a user can no longer use the device until the battery system is replaced). In some implementations, after detecting battery swelling, one or more device features are disabled and/or a user is notified.

Figure 2:
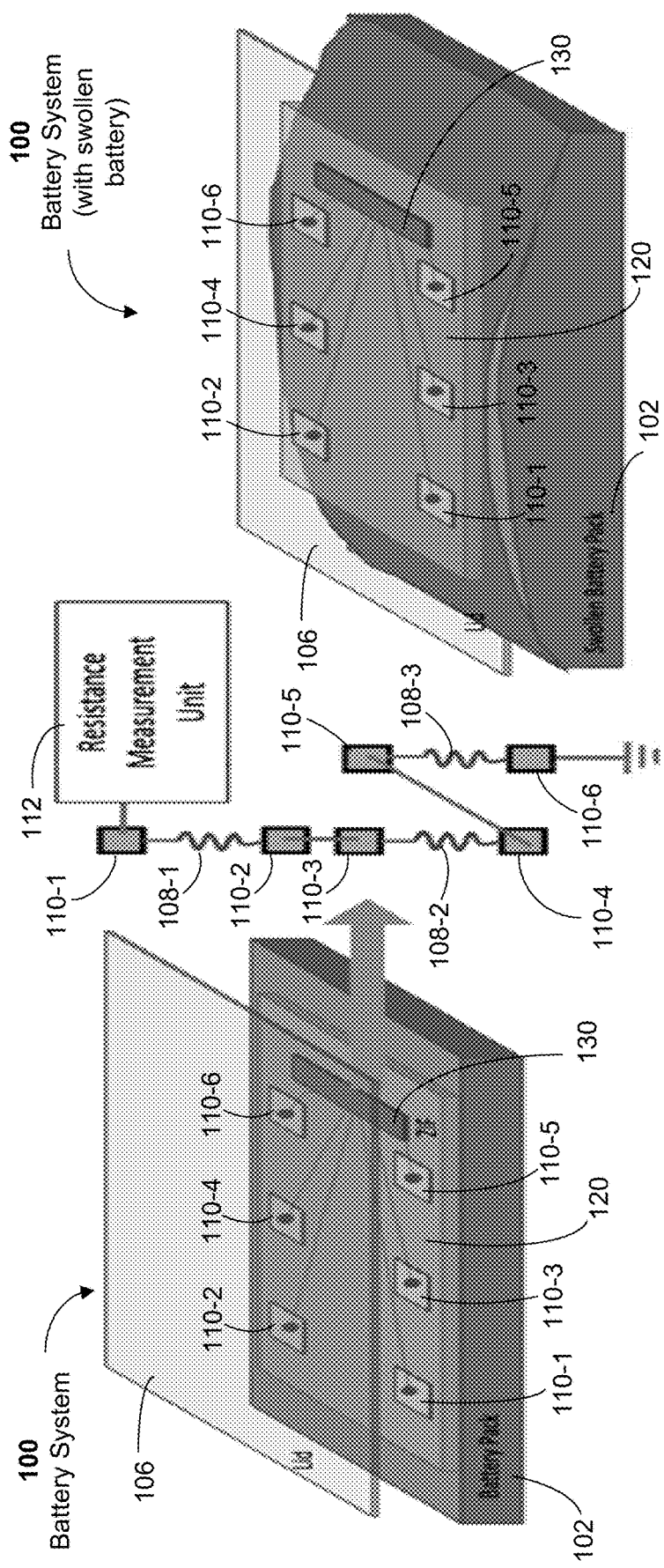
FIG. 2 illustrates an alternative configuration of the battery system for detecting swelling, in accordance with some implementations.

FIG. 2 illustrates an alternative configuration of the battery system 100 for detecting swelling, in accordance with some implementations. In some implementations of the apparatus 100, the flex layer 120 (discussed above in reference to FIG. 1A) is adhered to the first side of the battery pack 102, and the conductive layer is adhered to the bottom of the surface 106. In various configurations, the conductive layer, the flex layer, and the battery pack are placed differently relative to one another while still achieving the overall function of the arrangement. In FIG. 1A, the high resistance network is placed above the cell (battery pack 102) and the bridging elements are placed on the cell, whereas in FIG. 2, the placement of these elements is reversed (i.e., the resistive network is placed on cell, and the bridging elements are placed above). In some implementations, the resistive network (sometimes called the resistive pattern) is placed on the battery, and the conductive layer is placed on the surface opposite the battery pack (e.g., on a lid covering the battery pack).

In various configurations, a number of different materials or components are used to construct the resistive network or bridging elements, including flex circuits, circuit boards, discreet resistors, conductive traces with controlled resistance, conductive inks, metal foils, and metallic coated polymers.

FIG. 2 also illustrates a configuration of the system 100 where the resistors 108-1, 108-2, and 108-3 are connected to the respective pairs of conductive pads (e.g., the pads 110-1 and 11-2, the pads 110-3 and 110-4, and the pads 110-5 and 110-6) via a ZIF 130 (Zero Insertion Force) socket, in accordance with some implementations. The enlarged image in the middle illustrates the overall layout of the resistance circuit (resistive pattern) and the connection to the resistance measurement circuit 112, according to some implementations.

Figure 3A:
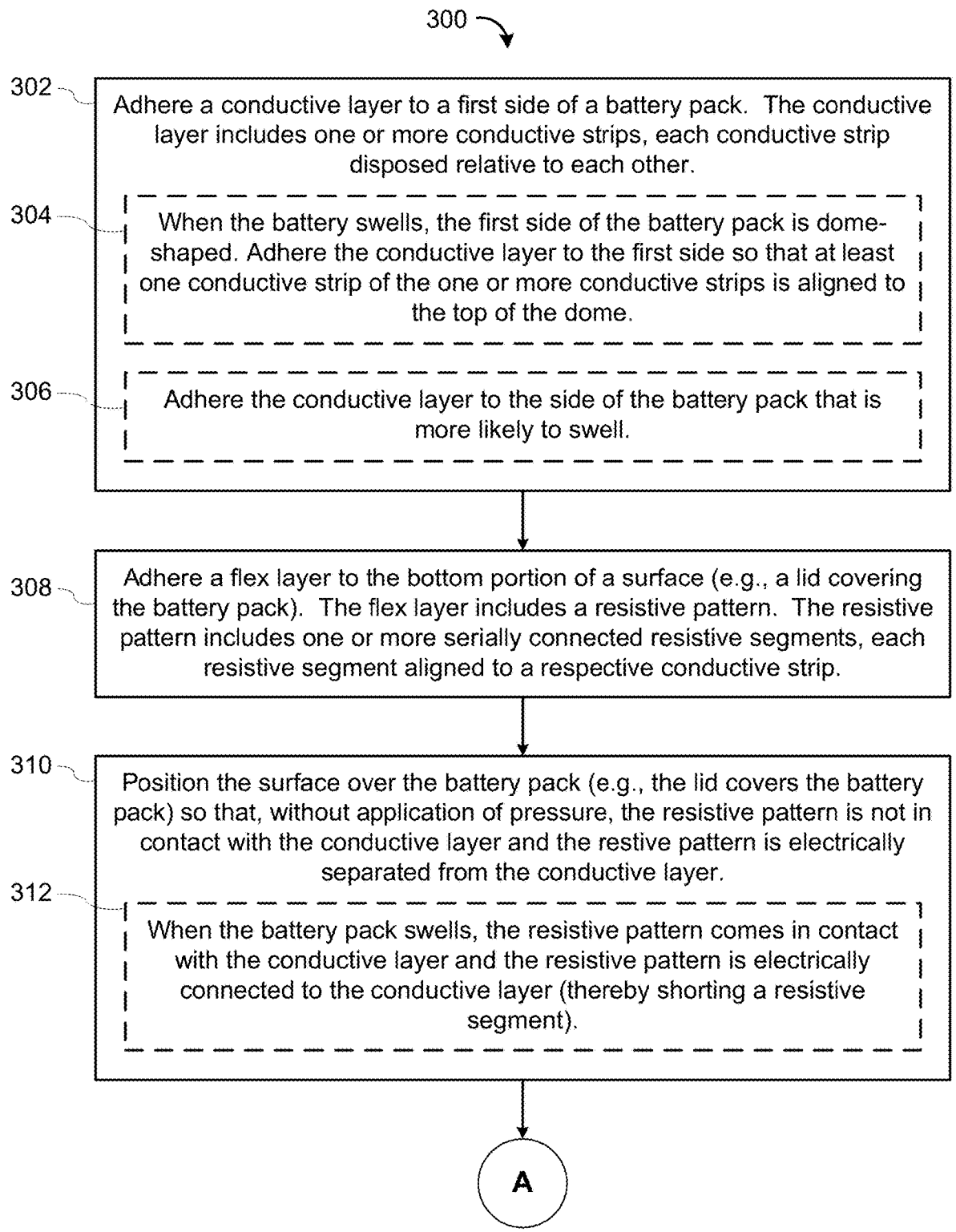
FIGS. 3A-3C provide a flowchart of a method for detecting battery swells according to some implementations.
Figure 3B:
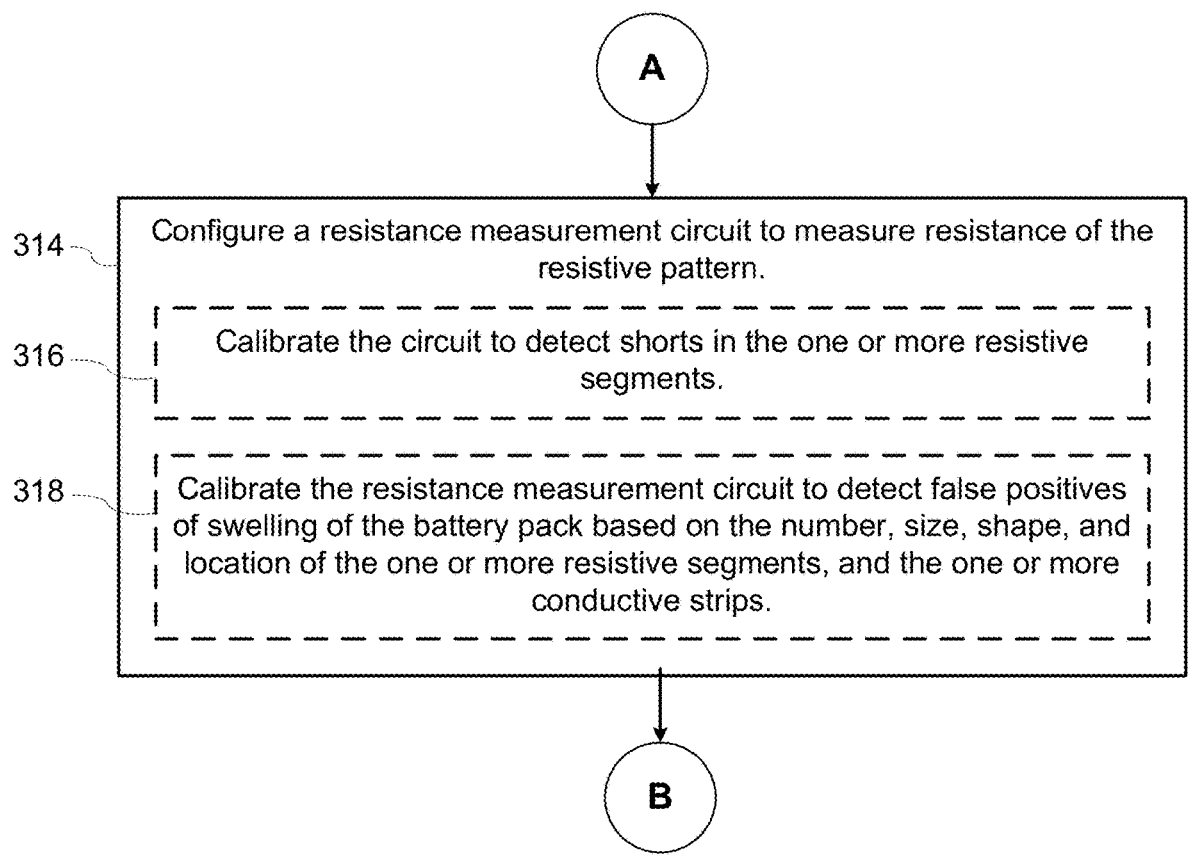
Figure 3C:
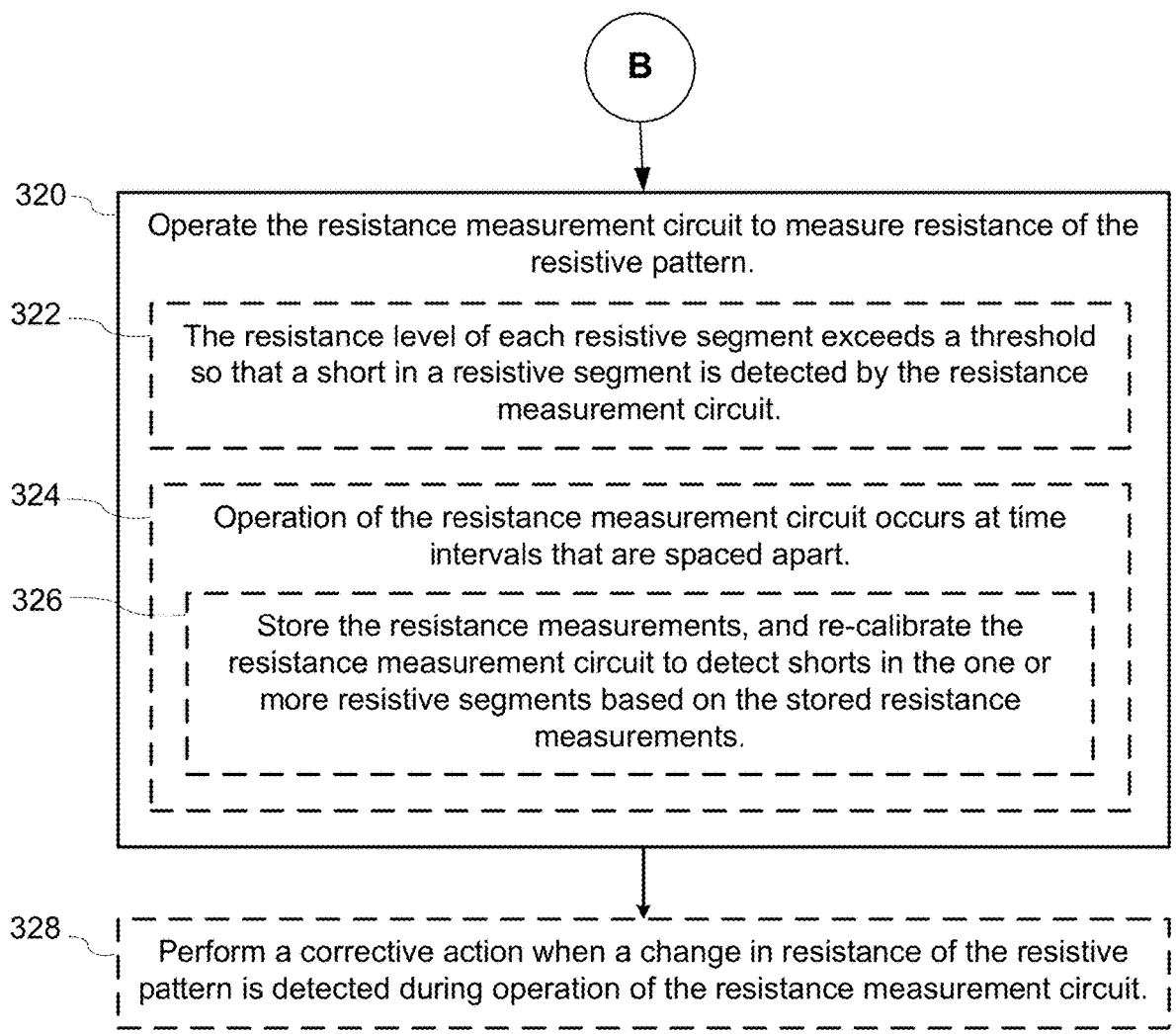

FIGS. 3A-3C provide a flowchart of a method 300 for detecting battery swells according to some implementations. The method 300 includes adhering (302) a conductive layer to a first side of a battery pack. The conductive layer includes (302) one or more conductive strips separated from each other. For example, in FIG. 1A, the conductive layer consists of the conductive tapes 104-1, 104-2, and 104-3, which are separated from each other. In some implementations, when the battery swells, the first side of the battery pack is (304) dome-shaped. The method 300 adheres (304) the conductive layer to the first side so that at least one conductive strip of the one or more conductive strips is aligned to the top of the dome. In some implementations, the method 300 adheres (306) the conductive layer to the side of the battery pack that is more likely to swell.

The method 300 also adheres (308) a flex layer 120 to a bottom portion of a surface 106. The flex layer 120 includes (308) a resistive pattern. The resistive pattern includes (308) one or more serially connected resistive segments, where each resistive segment aligns with a respective conductive strip. For example, FIG. 1A shows a first segment consisting of the conductive pads 110-1 and 110-2, and the resistor 108-1; a second segment consisting of the conductive pads 110-3 and 110-4, and the resistor 108-2; and a third segment consisting of the conductive pads 110-5 and 110-6, and the resistor 108-3.

The method 300 covers (310) the battery pack with the surface 106 so that, without application of pressure, the resistive pattern is not in contact with the conductive layer. In some implementations, when the battery pack swells, the resistive pattern contacts (312) the conductive layer, thereby shorting a resistive segment, as explained above in reference to FIG. 1B.

Referring next to FIG. 3B, the method 300 includes configuring (314) a resistance measurement circuit 112 to measure resistance of the resistive pattern. Configuring typically involves connecting and/or calibrating. In some implementations, configuring the resistance measurement circuit 112 comprises calibrating (316) the circuit to detect shorts in the one or more resistive segments. In some implementations, configuring the resistance measurement circuit comprises calibrating (318) the resistance measurement circuit 112 to detect false positives of swelling of the battery pack based on the number, size, shape, and/or location of the one or more resistive segments, and/or the one or more conductive strips.

Referring next to FIG. 3C, the method 300 operates (320) the resistance measurement circuit 112 to measure resistance of the resistive pattern. In some implementations, the resistance level of each resistive segment exceeds (322) a threshold so that a short in a resistive segment is detected by the resistance measurement circuit. In some implementations, operating the resistance measurement circuit occurs (324) at time intervals that are spaced apart (e.g., once per day, once every three days, or once per week). In some implementations, the method stores (326) the resistance measurements in a memory unit attached to the resistance measurement circuit 112, and re-calibrates the resistance measurement circuit to detect shorts in the one or more resistive segments based on the stored resistance measurements. In various implementations, the method 300 includes comparing a current measurement to a past measurement, comparing historical data, or comparing averages to detect shorts in the one or more resistive segments. In some implementations, the resistance measurement circuit is operated at very low duty cycles (e.g., <0.0001% of up-time of a product, such as 100 milliseconds every 24 hours). In some implementations, once the resistance measurement circuit 112 measures one or more abnormal resistance values, or when the circuit detects an unexpected drop in resistance, the periodic interval of operation of the circuit is increased (e.g., switching to hourly operation from daily operation) to detect any further changes in the resistance values (which could indicate a rapid deterioration in the battery).

In some implementations, the method 300 further includes performing (328) a corrective action when a change in resistance of the resistive pattern is detected during operation of the resistance measurement circuit. In some implementations, the corrective action includes sending an instruction to update the charging profile of the battery pack. The resistance measurement circuit 112 provides sufficient information in the instruction to the charging circuit so that the charging circuit can adapt appropriately (e.g., reduce the charging voltage in proportion to the amount of swelling). In some implementations, the corrective action includes applying a top off delay (for charging). In some implementations, the corrective action includes reducing the state of charge (SOC) of the battery (e.g., when the battery swelling exceeds a predetermined threshold). In some implementations, the corrective action includes alerting a customer care or service center when the battery swelling exceeds a predetermined threshold. As another example of the corrective action, suppose the battery supplies battery power to a device (e.g., a headset) and battery swelling is detected. In some implementations, the method 300 sends an instruction to disable the device (e.g., a user can no longer use the device until the battery system is replaced), sends an instruction to disable one or more device features, and/or notifies a user.

FIG. 4 illustrates a battery system configuration that can detect swelling, in accordance with some implementations. More specifically, FIG. 4 illustrates positioning of conductive pads to enable the resistance measurement circuit 112 to detect false positives, according to some implementations. FIG. 4 is a top-down view 400 of the back of a battery pack. Conductive pads 402, 404, 406, and 408 (similar to the conductive pads 110 in FIGS. 1A and 1B, such as 0.1-micron wide gold pads) are positioned or adhered to the back of a battery pack as shown. In particular, two of the conductive strips (strips 404 and 406) are positioned along an axis that is substantially perpendicular to section A-A, and the other two strips (strips 402 and 408) are positioned along an axis that is substantially parallel to section A-A. Each conductive strip is equidistant from its neighboring conductive strips. A surface (e.g., a battery lid similar to the surface 120 discussed above in FIGS. 1B and 2) is placed over the battery pack. One or more conductive tapes (e.g., the conductive tapes 104 discussed in FIGS. 1A and 1B) are adhered to the bottom of the surface, with each conductive tape aligned with a respective conductive pad.

During the course of operation of the battery pack, if and when the battery swells, the conductive pads come in contact with respective conductive strips, resulting in a short-circuit, which in turn causes a drop in resistance that is detected by the resistance measurement circuit 112. While operating to detect swells (e.g., after the resistance measurement circuit is calibrated and is operated to detect swelling), suppose the resistance measurement circuit detects that the conductive pads 404 and 406 caused a short-circuit by coming in contact with a respective conductive strip, but the conductive strips 402 and 408 did not cause a short-circuit. In this case, the resistance measurement circuit 112 can detect (or deduce) a false positive, because swelling tends to be uniform across the surface of the battery rather than along a particular axis. For example, even if the battery swelling starts along one axis, the swelling spreads roughly uniformly along other axes. By calibrating the circuit (e.g., selecting different resistance values for connecting conductive pads 402 and 408 relative to the conductive pads 404 and 406) beforehand, the resistance measurement circuit can detect which of the conductive pads was responsible for causing a short-circuit.

Although not shown, other configurations of the conducting pads (e.g., including a greater number of conductive pads) are possible to detect false positives, to add fault tolerance capabilities, and/or to improve accuracy of the resistance measurement or swell detection. The conductive pads, for example, can be placed so that if one circuit (or sub-circuit) including a subset of the conductive pads fails, another circuit (or sub-circuit) including another subset of the conductive pads responds by detecting swelling and/or false positives.

In some implementations, the battery system is configured by replacing each of the conductive pads shown in FIG. 4 with respective conductive tapes or strips (e.g., tapes 104), and complementing each conductive tape with a respective conductive pad adhered to the bottom of the surface opposite the battery pack (as discussed above in reference to FIGS. 1A, 1B, and 2). In other words, the positions of the conductive pads and the conductive tapes are reversed (i.e., instead of being placed on the battery pack, the components are placed on the surface).

As discussed above in reference to FIGS. 1A, 1B, and 2, each conductive pad is connected to a neighboring conductive pad using a respective resistor, forming one or more resistive patterns. FIG. 4 illustrates a configuration where the resistors are not (physically) positioned adjacent to the conductive pads. The resistors (not shown) can be positioned elsewhere on the battery pack (or even on the surface opposite the battery pack) without affecting the overall operation of the resistance measurement circuit.

As shown in the sectional view of section A-A in FIG. 4, some implementations adhere a pressure sensitive adhesive 414 (e.g., PSA TESA 4982) over the conductive pads. Some implementations adhere a flex printed circuit 412 (sometimes called a FPC, or a flexible printed circuit) over the conductive pads. Some implementations use a release liner 410 (e.g., a paper or plastic-based film sheet) to prevent a sticky surface (e.g., an FPC or the conductive pads) from adhering to external components. Some configurations have a bend region 420 that acts as an electrical conduit to carry the electrical connections from the battery pack or the conducting pads to an external circuit (e.g., to an external resistance measurement circuit or a headset receiving charge from the battery system).

Further, as shown in the sectional view of section B-B in FIG. 4, some configurations or implementations use a stiffener 418 (e.g., PI stiffener) for securing (sometimes called stiffening) the battery system, and/or a sealing material 416 (e.g., a polyurethane microcellular foam) for protection of sensitive parts of the battery system.

Figure 5:
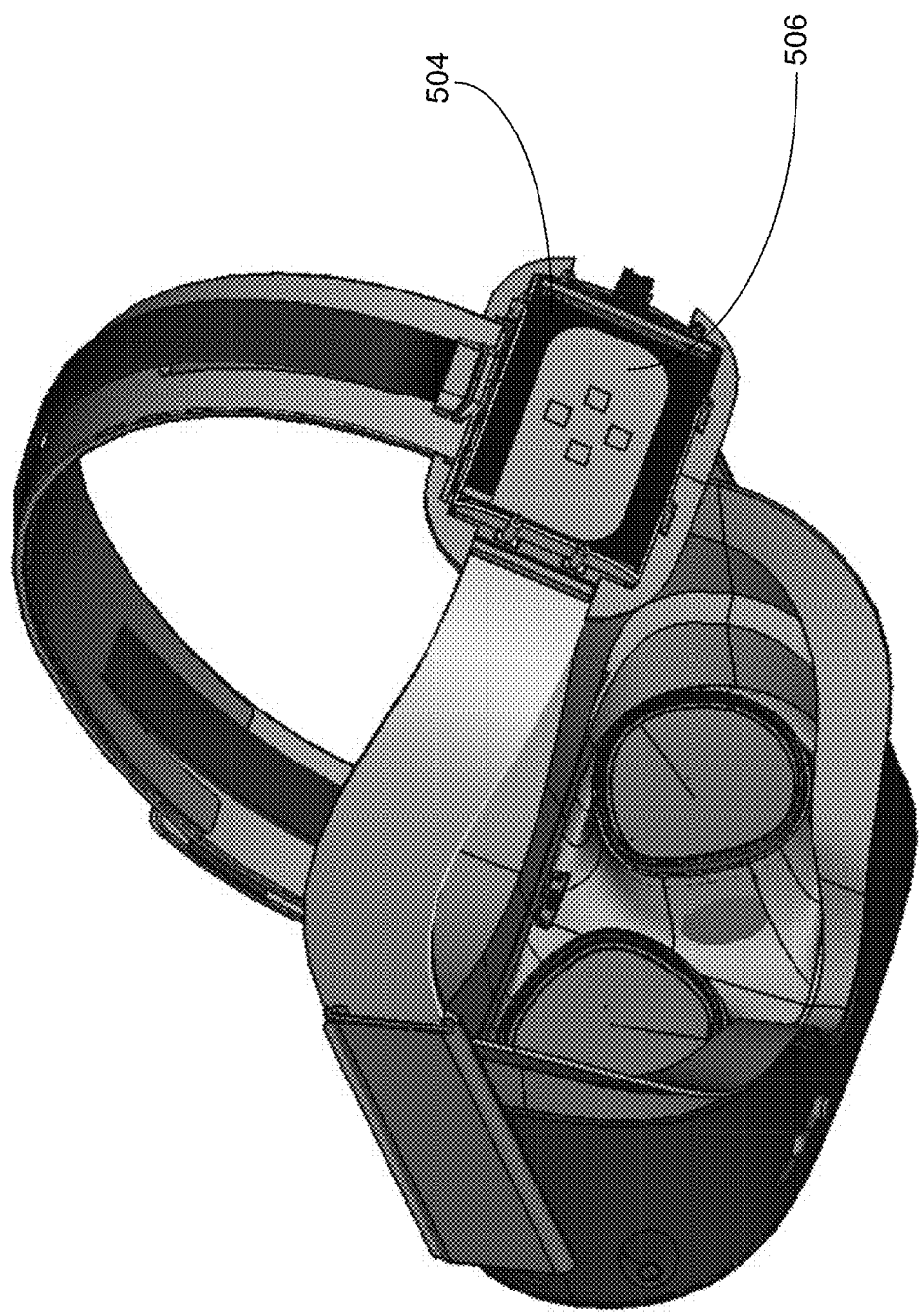
FIG. 5 illustrates a headset assembly (e.g., a virtual reality headset) that includes a battery system configuration that detects swelling, according to some implementations.

FIG. 5 illustrates a headset assembly 500 (e.g., a virtual reality headset) that includes a battery system 504, which is positioned to be worn by a user at the back of the head, according to some implementations. The configuration detects swelling using a swell detector 506 (e.g., the configuration described above in reference to FIG. 4) adhered to a battery pack. In FIG. 5, the battery lid for the battery pack is removed to show the swell detector 506. In some implementations, some components of the swell detector 506 are adhered to the inside (sometimes referred to as the bottom) of the battery lid.

Artificial reality systems may be implemented in a variety of different form factors and configurations. Some artificial reality systems are designed to work without near-eye displays (NEDs), an example of which is the AR system 600 described below in reference to FIG. 6. Other artificial reality systems may include an NED, which provides visibility into the real world (e.g., the AR system 700 described below in reference to FIG. 7) or that visually immerses a user in an artificial reality (e.g., the VR system 800 described below in reference to FIG. 8). While some artificial reality devices are self-contained systems, other artificial reality devices communicate and/or coordinate with external devices to provide an artificial reality experience to a user. Examples of such external devices include handheld controllers, mobile devices, desktop computers, devices worn by a user (e.g., a wearable device), devices worn by one or more other users, and/or any other suitable external system.

Figure 6:
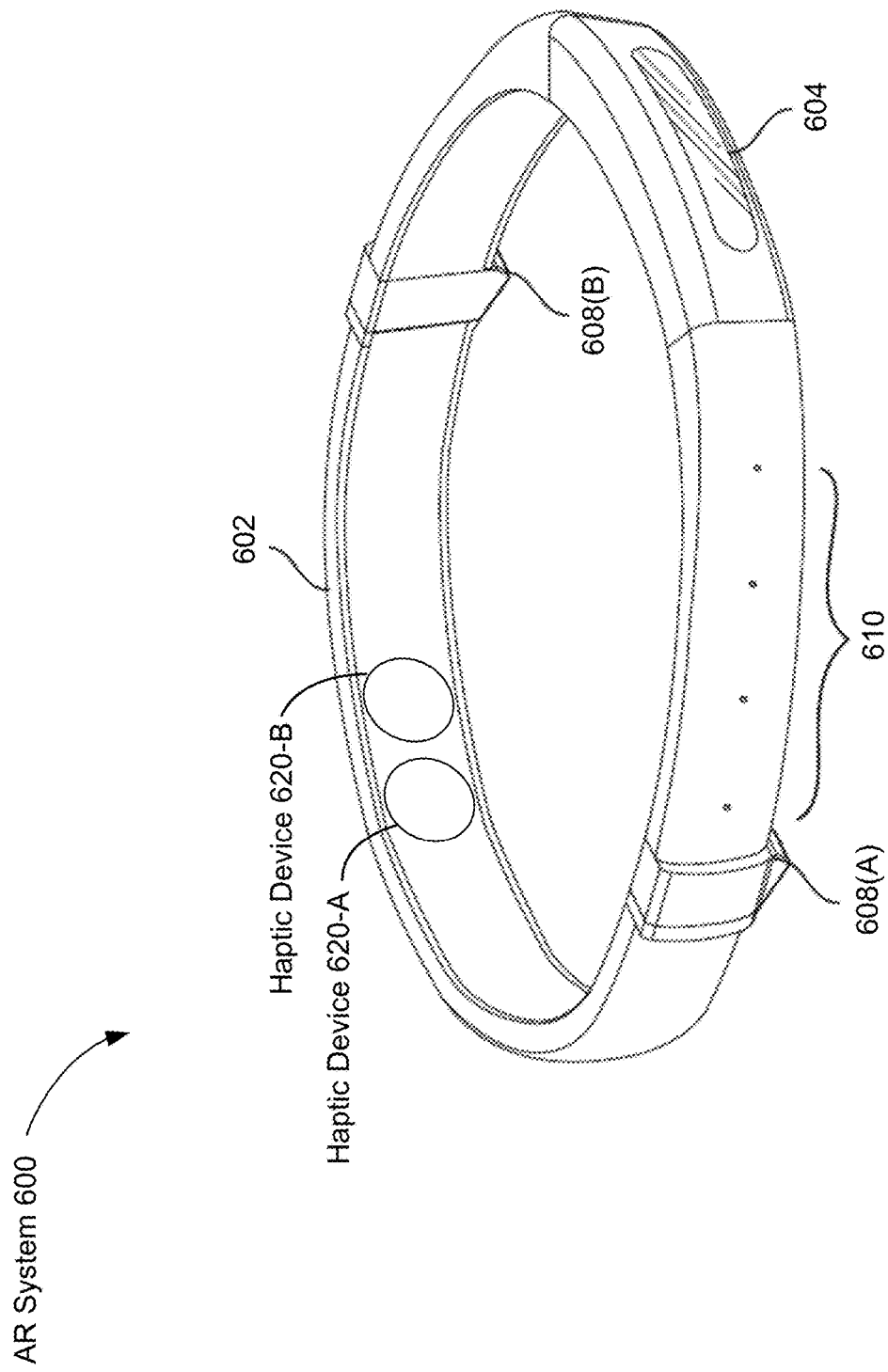
FIG. 6 illustrates an embodiment of an artificial reality device.
Figure 7:
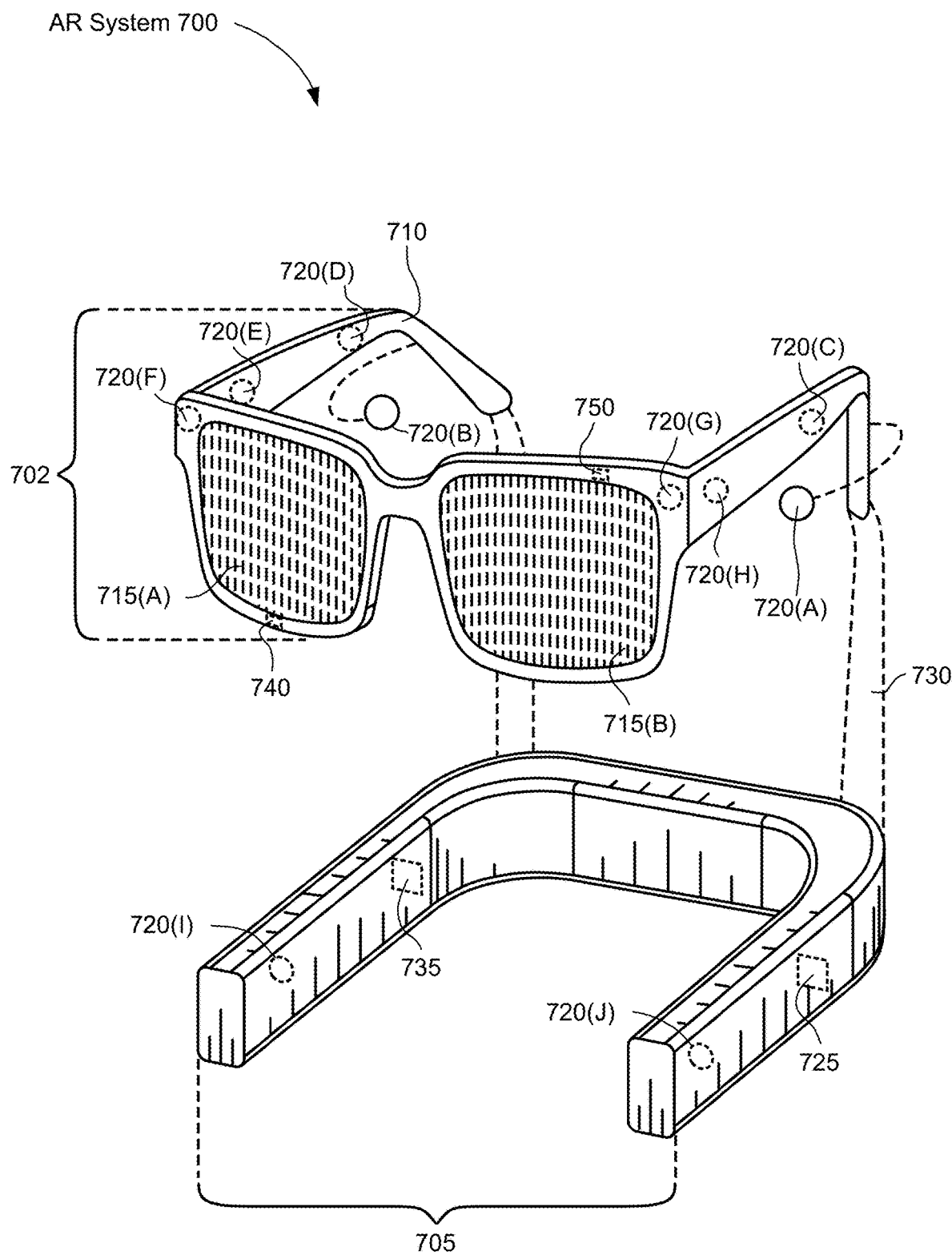
FIG. 7 illustrates an embodiment of an augmented reality headset and a corresponding neckband.
Figure 8:
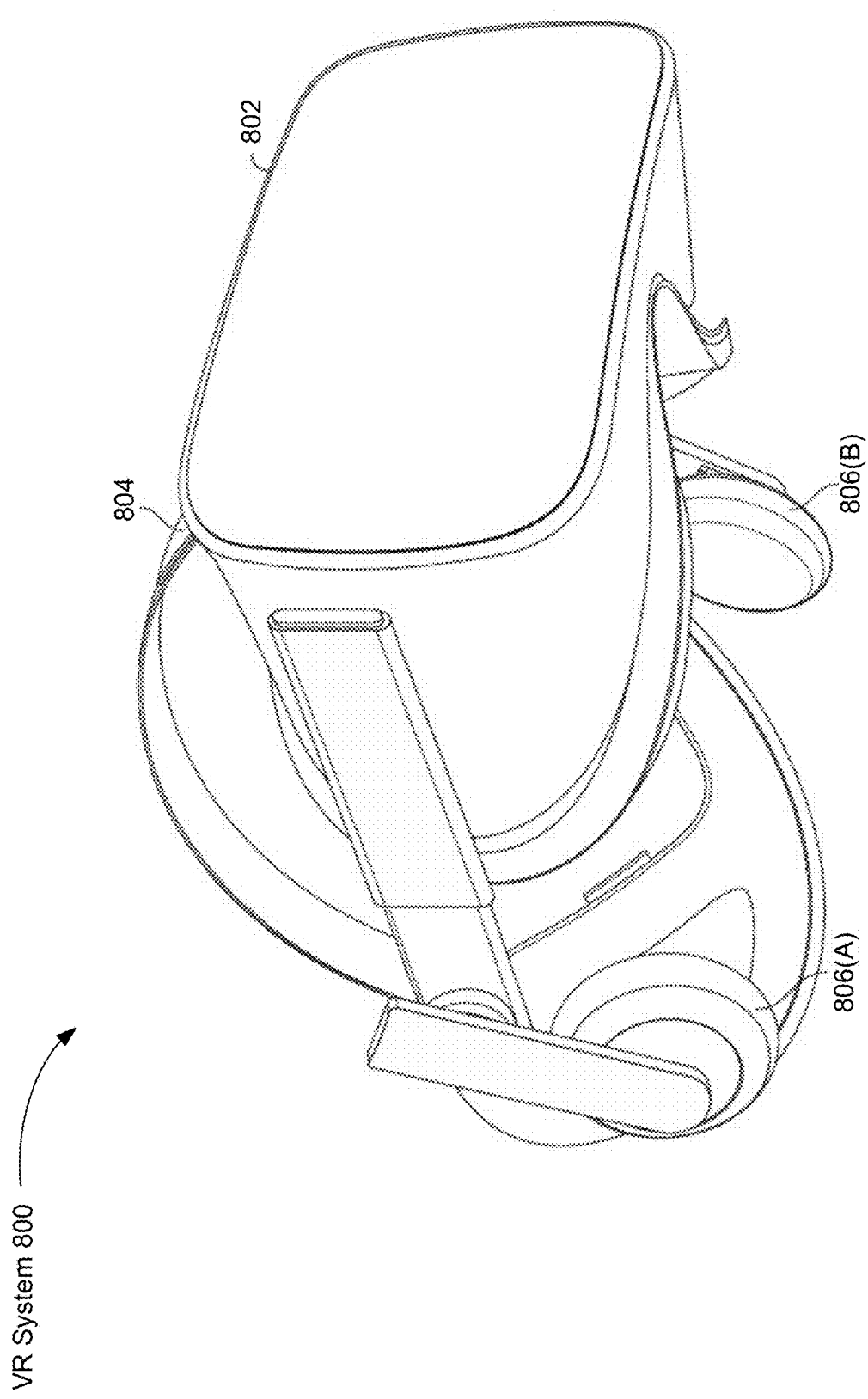
FIG. 8 illustrates an embodiment of a virtual reality headset.

FIGS. 6-8 provide examples of artificial devices that may utilize battery pack embodiments described herein. The AR system 600 in FIG. 6 generally represents a wearable device dimensioned to fit about a body part (e.g., a head) of a user. The AR system 600 may include the functionality of a wearable device, and may include additional functions not described above. As shown, the AR system 600 includes a frame 602 (e.g., band) and a camera assembly 604, which is coupled to the frame 602 and configured to gather information about a local environment by observing the local environment. The AR system 600 may also include one or more transducers. In one example, the AR system 600 includes output transducers 608(A) and 608(B) and input transducers 610. The output transducers 608(A) and 608(B) may provide audio feedback, haptic feedback, and/or content to a user, and input audio transducers may capture audio (or other signals/waves) in a user's environment.

In some embodiments, the AR system 600 includes one or more instances of haptic devices 620 (e.g., the haptic devices 620-A and 620-B). In this way, the AR system 600 is able to create haptic stimulations.

The AR system 600 does not include a near-eye display (NED) positioned in front of a user's eyes. AR systems without NEDs may take a variety of forms, such as head bands, hats, hair bands, belts, watches, wrist bands, ankle bands, rings, neckbands, necklaces, chest bands, eyewear frames, and/or any other suitable type or form of apparatus. While the AR system 600 may not include an NED, the AR system 600 may include other types of screens or visual feedback devices (e.g., a display screen integrated into a side of the frame 602).

The embodiments discussed in this disclosure may also be implemented in AR systems that include one or more NEDs. For example, as shown in FIG. 7, the AR system 700 may include an eyewear device 702 with a frame 710 configured to hold a right display device 715(A) and a left display device 715(B) in front of a user's eyes. The display devices 715(A) and 715(B) may act together or independently to present an image or series of images to a user. While the AR system 700 includes two displays, embodiments of this disclosure may be implemented in AR systems with a single NED or more than two NEDs.

In some embodiments, the AR system 700 may include one or more sensors, such as the sensors 740 and 750. The sensors 740 and 750 may generate measurement signals in response to motion of the AR system 700 and may be located on substantially any portion of frame 710. The sensors 740 and 750 may include a position sensor, an inertial measurement unit (IMU), a depth camera assembly, or any combination thereof. The AR system 700 may or may not include sensors or may include more than one sensor. In embodiments in which the sensor 740 or the sensor 750 is an IMU, the IMU may generate calibration data based on measurement signals from the sensor. Examples of the sensors 740 and 750 include, without limitation, accelerometers, gyroscopes, magnetometers, other suitable types of sensors that detect motion, sensors used for error correction of the IMU, or some combination thereof.

The AR system 700 may also include a microphone array with a plurality of acoustic sensors 720(A)-720(J), referred to collectively as the acoustic sensors 720. The acoustic sensors 720 may be transducers that detect air pressure variations induced by sound waves. Each acoustic sensor 720 may be configured to detect sound and convert the detected sound into an electronic format (e.g., an analog or digital format). The microphone array in FIG. 7 may include, for example, ten acoustic sensors: 720(A) and 720(B), which may be designed to be placed inside a corresponding ear of the user, acoustic sensors 720(C), 720(D), 720(E), 720(F), 720(G), and 720(H), which may be positioned at various locations on the frame 710, and/or acoustic sensors 720(I) and 720(J), which may be positioned on a corresponding neckband 705. In some embodiments, the neckband 705 is a computer system.

The configuration of acoustic sensors 720 of the microphone array may vary. While the AR system 700 is shown in FIG. 7 as having ten acoustic sensors 720, the number of acoustic sensors 720 may be greater or less than ten. In some embodiments, using more acoustic sensors 720 may increase the amount of audio information collected and/or the sensitivity and accuracy of the audio information. In contrast, using fewer acoustic sensors 720 may decrease the computing power required by a controller 725 to process the collected audio information. In addition, the position of each acoustic sensor 720 of the microphone array may vary. For example, the position of an acoustic sensor 720 may include a defined position on the user, a defined coordinate on the frame 710, an orientation associated with each acoustic sensor, or some combination thereof.

The acoustic sensors 720(A) and 720(B) may be positioned on different parts of the user's ear, such as behind the pinna or within the auricle or fossa. Or, there may be additional acoustic sensors on or surrounding the ear in addition to acoustic sensors 720 inside the ear canal. Having an acoustic sensor positioned next to an ear canal of a user may enable the microphone array to collect information on how sounds arrive at the ear canal. By positioning at least two of the acoustic sensors 720 on either side of a user's head (e.g., as binaural microphones), the AR device 700 may simulate binaural hearing and capture a 3D stereo sound field around about a user's head. In some embodiments, the acoustic sensors 720(A) and 720(B) may be connected to the AR system 700 via a wired connection, and in other embodiments, the acoustic sensors 720(A) and 720(B) may be connected to the AR system 700 via a wireless connection (e.g., a Bluetooth connection). In still other embodiments, acoustic sensors 720(A) and 720(B) may not be used at all in conjunction with the AR system 700.

The acoustic sensors 720 on the frame 710 may be positioned along the length of the temples, across the bridge, above or below the display devices 715(A) and 715(B), or some combination thereof. The acoustic sensors 720 may be oriented such that the microphone array is able to detect sounds in a wide range of directions surrounding the user wearing AR system 700. In some embodiments, an optimization process may be performed during manufacturing of AR system 700 to determine relative positioning of each acoustic sensor 720 in the microphone array.

The AR system 700 may further include or be connected to an external device (e.g., a paired device), such as a neckband 705. As shown, the neckband 705 may be coupled to the eyewear device 702 via one or more connectors 730. The connectors 730 may be wired or wireless connectors and may include electrical and/or non-electrical (e.g., structural) components. In some cases, the eyewear device 702 and the neckband 705 may operate independently without any wired or wireless connection between them. While FIG. 7 illustrates the components of the eyewear device 702 and the neckband 705 in example locations on the eyewear device 702 and the neckband 705, the components may be located elsewhere and/or distributed differently on the eyewear device 702 and/or the neckband 705. In some embodiments, the components of the eyewear device 702 and the neckband 705 may be located on one or more additional peripheral devices paired with the eyewear device 702, the neckband 705, or some combination thereof. Furthermore, the neckband 705 generally represents any type or form of paired device. Thus, the following discussion of neckband 705 may also apply to various other paired devices, such as smart watches, smart phones, wrist bands, other wearable devices, hand-held controllers, tablet computers, or laptop computers.

Pairing external devices, such as a neckband 705, with AR eyewear devices may enable the eyewear devices to achieve the form factor of a pair of glasses while still providing sufficient battery and computation power for expanded capabilities. Some or all of the battery power, computational resources, and/or additional features of the AR system 700 may be provided by a paired device or shared between a paired device and an eyewear device, thus reducing the weight, heat profile, and form factor of the eyewear device overall while still retaining desired functionality. For example, the neckband 705 may allow components that would otherwise be included on an eyewear device to be included in the neckband 705 because users may tolerate a heavier weight load on their shoulders than they would tolerate on their heads. The neckband 705 may also have a larger surface area over which to diffuse and disperse heat to the ambient environment. Thus, the neckband 705 may allow for greater battery and computation capacity than might otherwise have been possible on a stand-alone eyewear device. Because weight carried in the neckband 705 may be less invasive to a user than weight carried in the eyewear device 702, a user may tolerate wearing a lighter eyewear device and carrying or wearing the paired device for greater lengths of time than the user would tolerate wearing a heavy standalone eyewear device, thereby enabling an artificial reality environment to be incorporated more fully into a user's day-to-day activities.

The neckband 705 may be communicatively coupled with the eyewear device 702 and/or to other devices. The other devices may provide certain functions (e.g., tracking, localizing, depth mapping, processing, storage, etc.) to the AR system 700. In the embodiment of FIG. 7, the neckband 705 may include two acoustic sensors 720(I) and 720(J), which are part of the microphone array (or potentially form their own microphone subarray). The neckband 705 may also include a controller 725 and a power source 735.

The acoustic sensors 720(I) and 720(J) of the neckband 705 may be configured to detect sound and convert the detected sound into an electronic format (analog or digital). In the embodiment of FIG. 7, the acoustic sensors 720(I) and 720(J) may be positioned on the neckband 705, thereby increasing the distance between neckband acoustic sensors 720(I) and 720(J) and the other acoustic sensors 720 positioned on the eyewear device 702. In some cases, increasing the distance between the acoustic sensors 720 of the microphone array may improve the accuracy of beamforming performed via the microphone array. For example, if a sound is detected by the acoustic sensors 720(C) and 720(D) and the distance between acoustic sensors 720(C) and 720(D) is greater than, for example, the distance between the acoustic sensors 720(D) and 720(E), the determined source location of the detected sound may be more accurate than if the sound had been detected by the acoustic sensors 720(D) and 720(E).

The controller 725 of the neckband 705 may process information generated by the sensors on the neckband 705 and/or the AR system 700. For example, the controller 725 may process information from the microphone array, which describes sounds detected by the microphone array. For each detected sound, the controller 725 may perform a direction of arrival (DOA) estimation to estimate a direction from which the detected sound arrived at the microphone array. As the microphone array detects sounds, the controller 725 may populate an audio data set with the information. In embodiments in which the AR system 700 includes an IMU, the controller 725 may compute all inertial and spatial calculations from the IMU located on the eyewear device 702. The connector 730 may convey information between the AR system 700 and the neckband 705 and between the AR system 700 and the controller 725. The information may be in the form of optical data, electrical data, wireless data, or any other transmittable data form. Moving the processing of information generated by the AR system 700 to the neckband 705 may reduce weight and heat in the eyewear device 702, making it more comfortable to a user.

The power source 735 in the neckband 705 may provide power to the eyewear device 702 and/or to the neckband 705. The power source 735 may include, without limitation, lithium-ion batteries, lithium-polymer batteries, primary lithium batteries, alkaline batteries, or any other form of power storage. In some cases, the power source 735 may be a wired power source. Including the power source 735 on the neckband 705 instead of on the eyewear device 702 may help better distribute the weight and heat generated by the power source 735.

As noted, some artificial reality systems may, instead of blending an artificial reality with actual reality, substantially replace one or more of a user's sensory perceptions of the real world with a virtual experience. One example of this type of system is a head-worn display system, such as the VR system 800 in FIG. 8, which mostly or completely covers a user's field of view. the VR system 800 may include a front rigid body 802 and a band 804 shaped to fit around a user's head. the VR system 800 may also include output audio transducers 806(A) and 806(B). Furthermore, while not shown in FIG. 8, the front rigid body 802 may include one or more electronic elements, including one or more electronic displays, one or more IMUS, one or more tracking emitters or detectors, and/or any other suitable device or system for creating an artificial reality experience. Although not shown, the VR system 800 may include a computer system.

Artificial reality systems may include a variety of types of visual feedback mechanisms. For example, display devices in the AR system 700 and/or the VR system 800 may include one or more liquid-crystal displays (LCDs), light emitting diode (LED) displays, organic LED (OLED) displays, and/or any other suitable type of display screen. Artificial reality systems may include a single display screen for both eyes or may provide a display screen for each eye, which may allow for additional flexibility for varifocal adjustments or for correcting a user's refractive error. Some artificial reality systems also include optical subsystems having one or more lenses (e.g., conventional concave or convex lenses, Fresnel lenses, or adjustable liquid lenses) through which a user may view a display screen.

In addition to or instead of using display screens, some artificial reality systems include one or more projection systems. For example, display devices in the AR system 700 and/or the VR system 800 may include micro-LED projectors that project light (e.g., using a waveguide) into display devices, such as clear combiner lenses that allow ambient light to pass through. The display devices may refract the projected light toward a user's pupil and may enable a user to simultaneously view both artificial reality content and the real world. Artificial reality systems may also be configured with any other suitable type or form of image projection system.

Artificial reality systems may also include various types of computer vision components and subsystems. For example, the AR system 600, the AR system 700, and/or the VR system 800 may include one or more optical sensors such as two-dimensional (2D) or three-dimensional (3D) cameras, time-of-flight depth sensors, single-beam or sweeping laser rangefinders, 3D LiDAR sensors, and/or any other suitable type or form of optical sensor. An artificial reality system may process data from one or more of these sensors to identify a location of a user, to map the real world, to provide a user with context about real-world surroundings, and/or to perform a variety of other functions.

Artificial reality systems may also include one or more input and/or output audio transducers. In the examples shown in FIGS. 6 and 8, the output audio transducers 608(A), 608(B), 806(A), and 806(B) may include voice coil speakers, ribbon speakers, electrostatic speakers, piezoelectric speakers, bone conduction transducers, cartilage conduction transducers, and/or any other suitable type or form of audio transducer. Similarly, the input audio transducers 610 may include condenser microphones, dynamic microphones, ribbon microphones, and/or any other type or form of input transducer. In some embodiments, a single transducer may be used for both audio input and audio output.

The artificial reality systems shown in FIGS. 6-8 may include tactile (i.e., haptic) feedback systems, which may be incorporated into headwear, gloves, body suits, handheld controllers, environmental devices (e.g., chairs or floor mats), and/or any other type of device or system, such as a wearable device. Additionally, in some embodiments, the haptic feedback systems may be incorporated with the artificial reality systems (e.g., the AR system 600 may include the haptic devices 620-A and 620-B). Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independently of other artificial reality devices, within other artificial reality devices, and/or in conjunction with other artificial reality devices.

By providing haptic sensations, audible content, and/or visual content, artificial reality systems may create an entire virtual experience or enhance a user's real-world experience in a variety of contexts and environments. For instance, artificial reality systems may assist or extend a user's perception, memory, or cognition within a particular environment. Some systems may enhance a user's interactions with other people in the real world or may enable more immersive interactions with other people in a virtual world. Artificial reality systems may also be used for educational purposes (e.g., for teaching or training in schools, hospitals, government organizations, military organizations, or business enterprises), entertainment purposes (e.g., for playing video games, listening to music, or watching video content), and/or for accessibility purposes (e.g., as hearing aids or vision aids). The embodiments disclosed herein may enable or enhance a user's artificial reality experience in one or more of these contexts and environments and/or in other contexts and environments.

Embodiments of this disclosure may include or be implemented in conjunction with various types of artificial reality systems. Artificial reality may constitute a form of reality that has been altered by virtual objects for presentation to a user. Such artificial reality may include and/or represent VR, AR, MR, hybrid reality, or some combination and/or variation of one or more of the these. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to a viewer). Additionally, in some embodiments, artificial reality may also be associated with applications, products, accessories, services, or some combination thereof, which are used to, for example, create content in an artificial reality and/or are otherwise used in (e.g., to perform activities in) an artificial reality.

The terminology used in the description of the invention herein is for the purpose of describing particular implementations only and is not intended to be limiting of the invention. As used in the description of the invention and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

The foregoing description, for purpose of explanation, has been described with reference to specific implementations. However, the illustrative discussions above are not intended to be exhaustive or to limit the invention to the precise forms disclosed. Many modifications and variations are possible in view of the above teachings. The implementations were chosen and described in order to best explain the principles of the invention and its practical applications, to thereby enable others skilled in the art to best utilize the invention and various implementations with various modifications as are suited to the particular use contemplated.

What is claimed is:

1. An apparatus for monitoring battery swelling, comprising:
   a battery pack;
   a conductive layer adhered to a first side of the battery pack, the conductive layer including one or more conductive strips, each conductive strip separated from the other conductive strips;
   a surface opposite the first side of the battery pack;
   a flex layer adhered to a bottom side of the surface, wherein the flex layer includes a resistive pattern, the resistive pattern includes one or more serially connected resistive segments, each resistive segment aligned with a respective conductive strip, and the surface is positioned opposite the battery pack so that, without application of pressure, the resistive pattern is not in contact with the conductive layer; and
   a resistance measurement circuit, connected to the resistive pattern, configured to detect changes in resistance of the resistive pattern.

2. The apparatus of claim 1, wherein the resistance measurement circuit is further configured to detect resistance changes at time intervals that are spaced apart.

3. The apparatus of claim 1, wherein when the battery pack swells, the first side of the battery pack forms a dome shape, and the conductive layer is adhered to the first side of the battery pack so that at least one conductive strip of the one or more conductive strips is aligned with a top of the dome.

4. The apparatus of claim 1, wherein when the battery pack swells, the resistive pattern comes in contact with the conductive layer, thereby shorting a resistive segment and causing the resistance measurement circuit to detect a change in resistance.

5. The apparatus of claim 1, wherein the resistance measurement circuit is further configured to perform a corrective action when a change in resistance of the resistive pattern is detected during operation of the resistance measurement circuit.

6. The apparatus of claim 1, wherein each resistive segment includes a resistor connected to a respective pair of conductive pads, the one or more resistive segments serially connected via the respective conductive pads.

7. The apparatus of claim 1, wherein a respective resistance of each resistive segment exceeds a threshold value, so that a short in a resistive segment is detected by the resistance measurement circuit.

8. The apparatus of claim 1, wherein the number, size, shape, and location of the one or more resistive segments, and the one or more conductive strips are determined so that the resistance measurement circuit detects false positives of swelling of the battery pack.

9. The apparatus of claim 1, wherein the resistance measurement circuit is coupled to a memory unit, and the resistance measurement circuit is further configured to detect and store resistances of the resistive pattern, and to use the stored resistances when determining changes in resistance of the resistive pattern.

10. The apparatus of claim 1, wherein each conductive strip is disposed laterally along a longitudinal centerline of the battery pack.

11. A method of monitoring battery swells, comprising:
    adhering a conductive layer to a first side of a battery pack, the conductive layer including one or more non-touching conductive strips;
    adhering a flex layer to a bottom portion of a surface, the flex layer including a resistive pattern including one or more serially connected resistive segments, wherein each resistive segment is aligned to a respective conductive strip;
    positioning the surface over the battery pack so that, without application of pressure, the resistive pattern is not in contact with the conductive layer;
    configuring a resistance measurement circuit to measure resistance of the resistive pattern; and
    operating the resistance measurement circuit to measure resistance of the resistive pattern.

12. The method of claim 11, wherein configuring the resistance measurement circuit comprises calibrating the resistance measurement circuit to detect shorts in the one or more resistive segments.

13. The method of claim 12, wherein a respective resistance of each resistive segment exceeds a threshold value and a short in a resistive segment is detected by the resistance measurement circuit when measured resistance falls below the threshold value.

14. The method of claim 12, wherein configuring the resistance measurement circuit further comprises calibrating the resistance measurement circuit to detect false positives of swelling of the battery pack based on a number, size, shape, and location of the one or more resistive segments, and the one or more conductive strips.

15. The method of claim 11, wherein operating the resistance measurement circuit occurs at time intervals that are spaced apart.

16. The method of claim 15, further comprising storing the resistance measurements, and re-calibrating the resistance measurement circuit to detect shorts in the one or more resistive segments based on the stored resistance measurements.

17. The method of claim 16, further comprising computing an average of the measured resistance of the resistive pattern and one or more of the stored resistance measurements.

18. The method of claim 11, further comprising positioning the surface over the battery pack so that, when the battery pack swells, the resistive pattern comes in contact with the conductive layer, thereby shorting a resistive segment.

19. The method of claim 11, wherein, when the battery pack swells, the first side of the battery pack is dome-shaped, and the method comprises adhering the conductive layer to the first side of the battery pack so that at least one conductive strip of the one or more conductive strips is aligned to a top of the dome.

20. The method of claim 11, further comprising performing a corrective action when a change in resistance of the resistive pattern is detected during operation of the resistance measurement circuit.

\* \* \* \* \*